(12) United States Patent
Li et al.

(10) Patent No.: US 11,810,856 B2
(45) Date of Patent: Nov. 7, 2023

(54) POWER MESH STRUCTURE FOR INTEGRATED CIRCUIT

(71) Applicant: FARADAY TECHNOLOGY CORPORATION, Hsinchu (TW)

(72) Inventors: Yi-Shan Li, Hsinchu (TW); Chi-Mao Chen, Hsinchu (TW); Duc Anh Nguyen, Hsinchu (TW); Po-Chen Lo, Hsinchu (TW); Shung-Ru Lin, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 266 days.

(21) Appl. No.: 17/510,974

(22) Filed: Oct. 26, 2021

(65) Prior Publication Data
US 2023/0093425 A1 Mar. 23, 2023

(30) Foreign Application Priority Data
Sep. 17, 2021 (TW) ................................ 110134814

(51) Int. Cl.
*H01L 23/528* (2006.01)

(52) U.S. Cl.
CPC .............................. *H01L 23/5286* (2013.01)

(58) Field of Classification Search
CPC .................................................. H01L 23/5286
See application file for complete search history.

(56) References Cited

U.S. PATENT DOCUMENTS

| 10,629,533 B2 * | 4/2020 | Kerr .................. H01L 23/49838 |
| 2009/0132988 A1 | 5/2009 | Chuang |
| 2015/0349526 A1 * | 12/2015 | Duby ........................ H02J 1/00 307/11 |
| 2017/0293583 A1 * | 10/2017 | Goto ........................ G06F 13/36 |

* cited by examiner

*Primary Examiner* — Peniel M Gumedzoe
(74) *Attorney, Agent, or Firm* — WPAT, P.C

(57) ABSTRACT

A power mesh structure for an integrated circuit is provided. A power switch cell is installed on the chip of the integrated circuit to control the switching operations of the power domain. The power meshes of the power mesh structure is specially designed. The power wires with different electrical properties are arranged in the same column or the same row to reduce the layout area of the power mesh on the material layer.

11 Claims, 8 Drawing Sheets

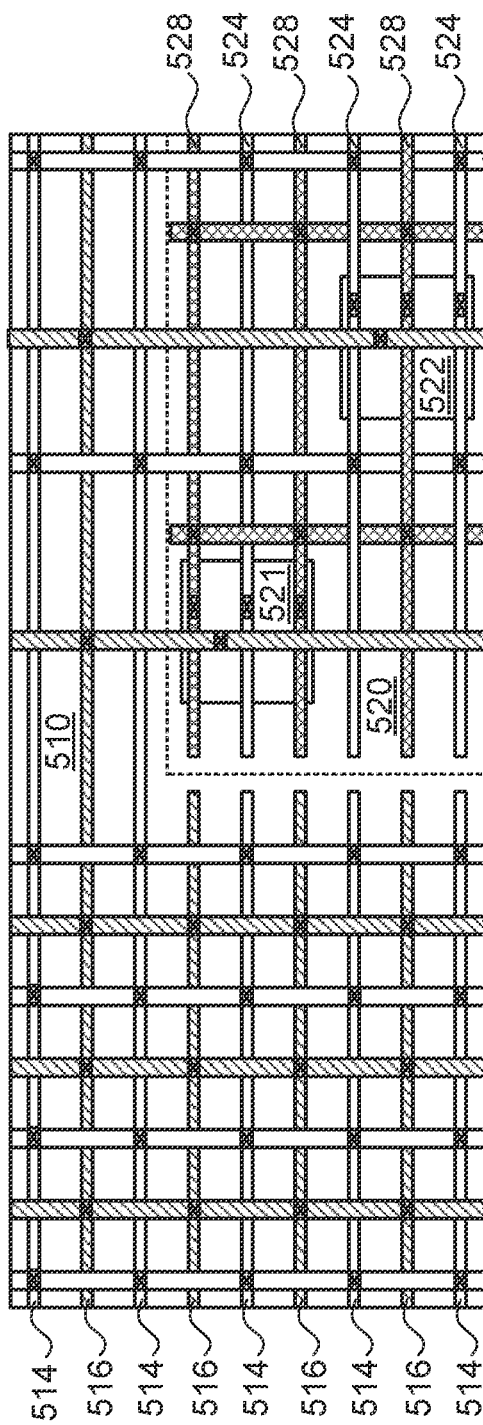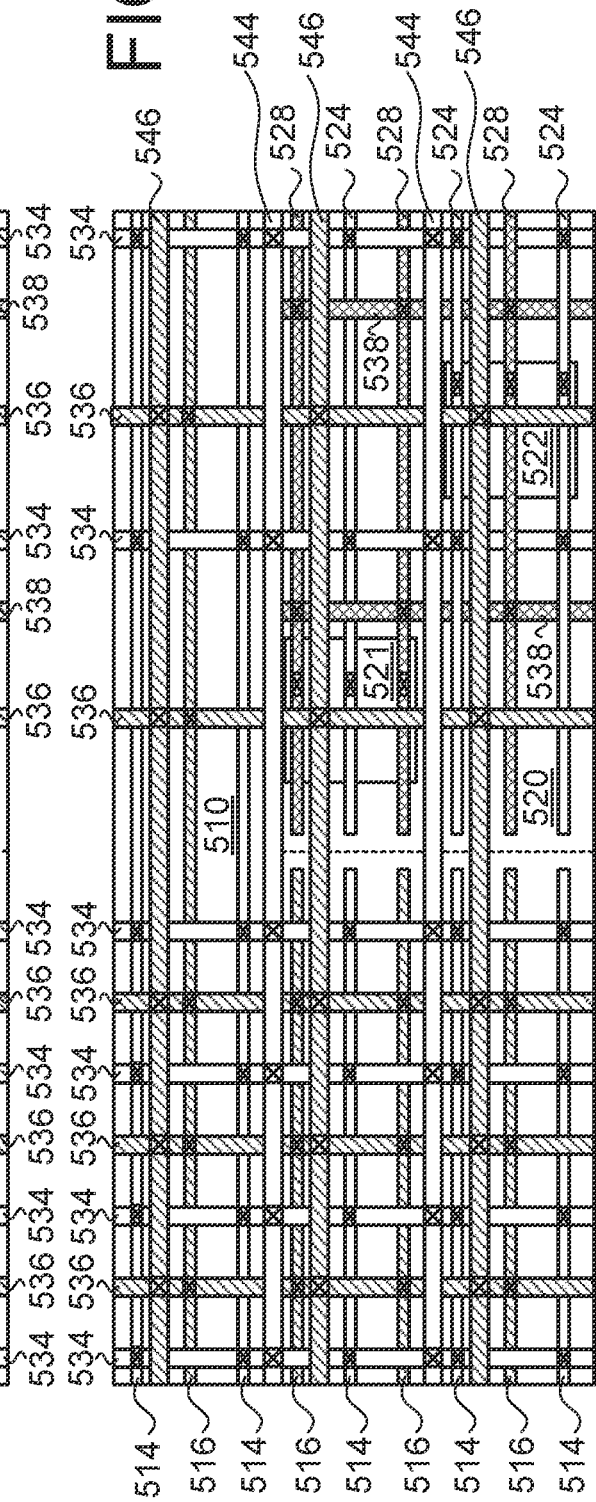

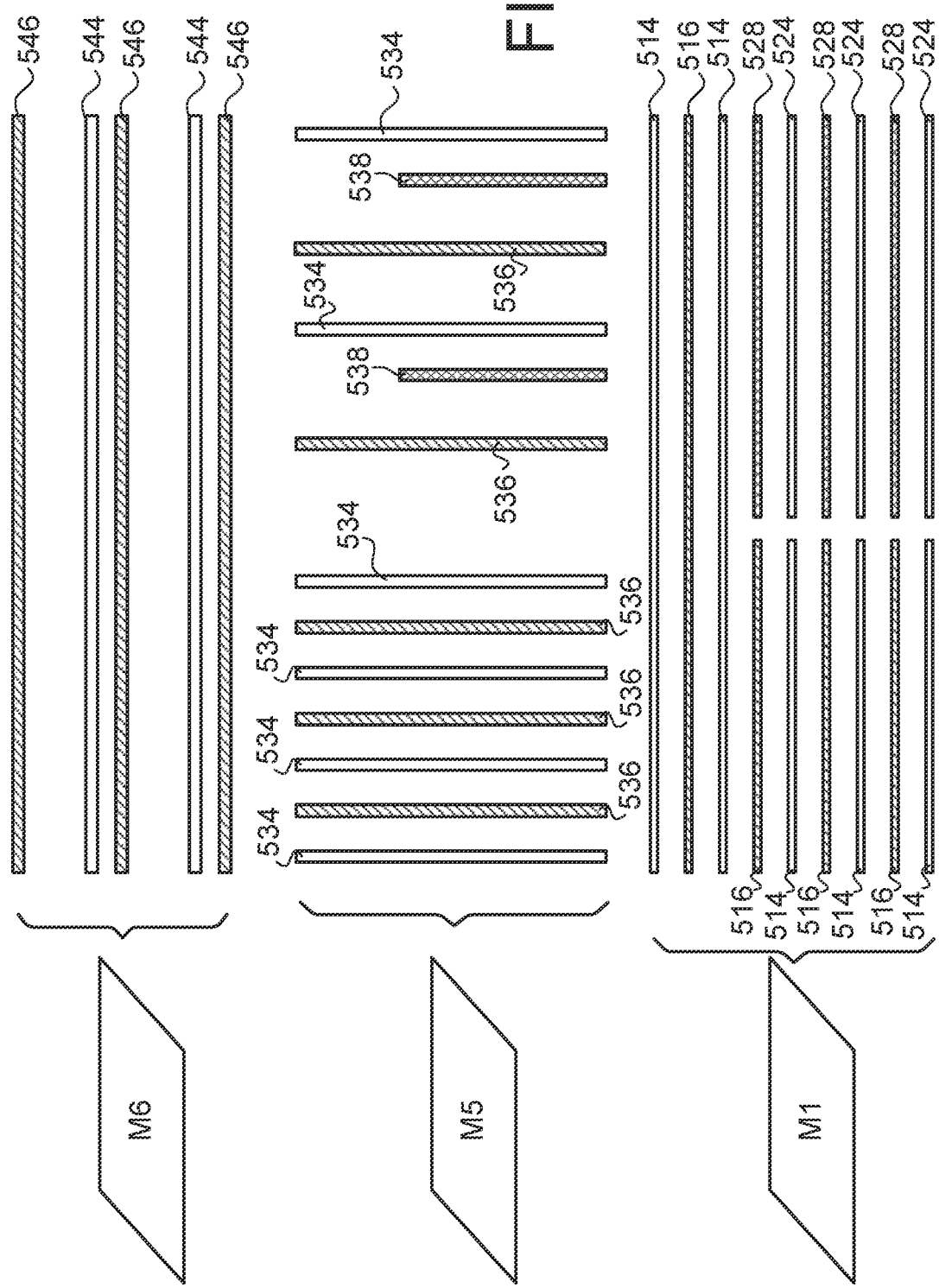

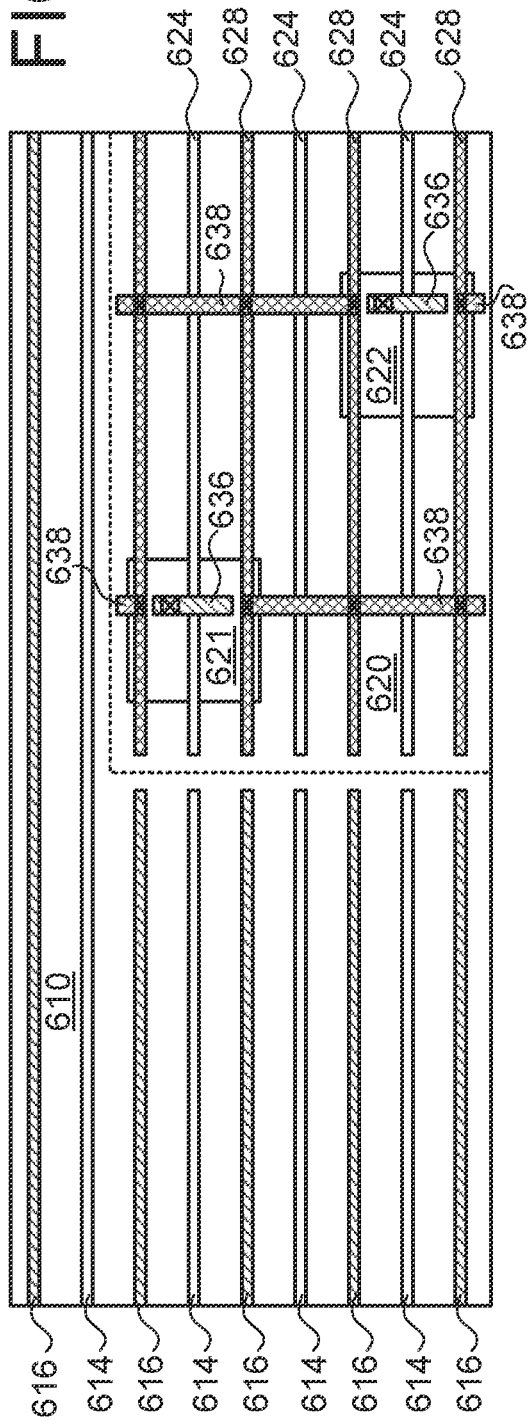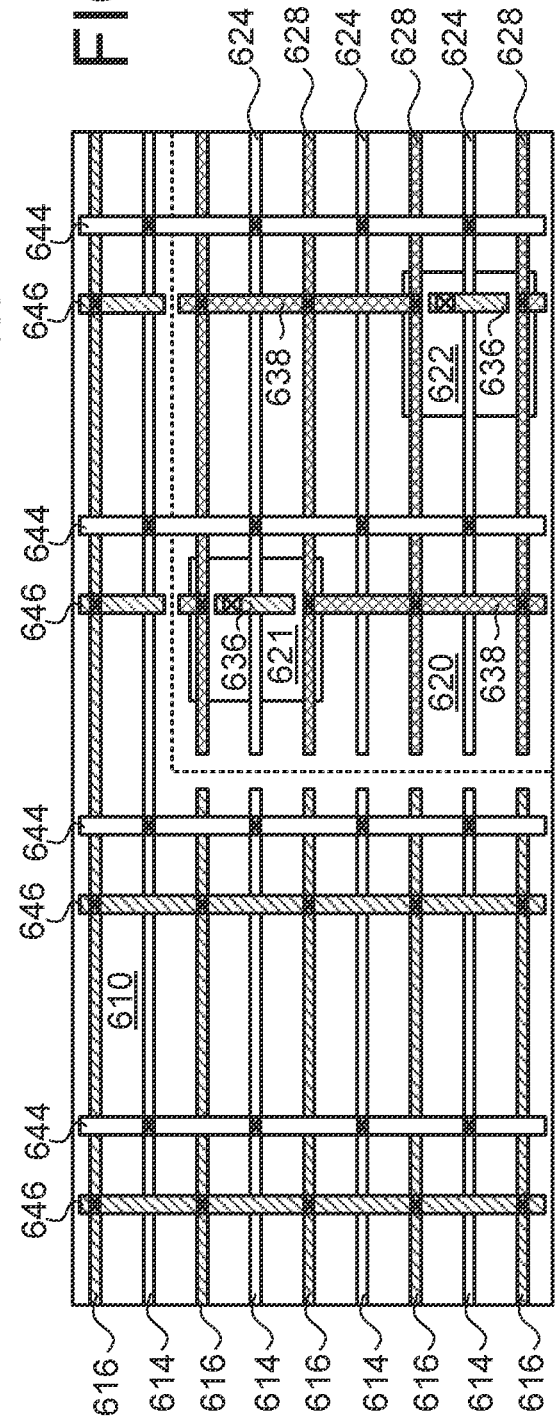

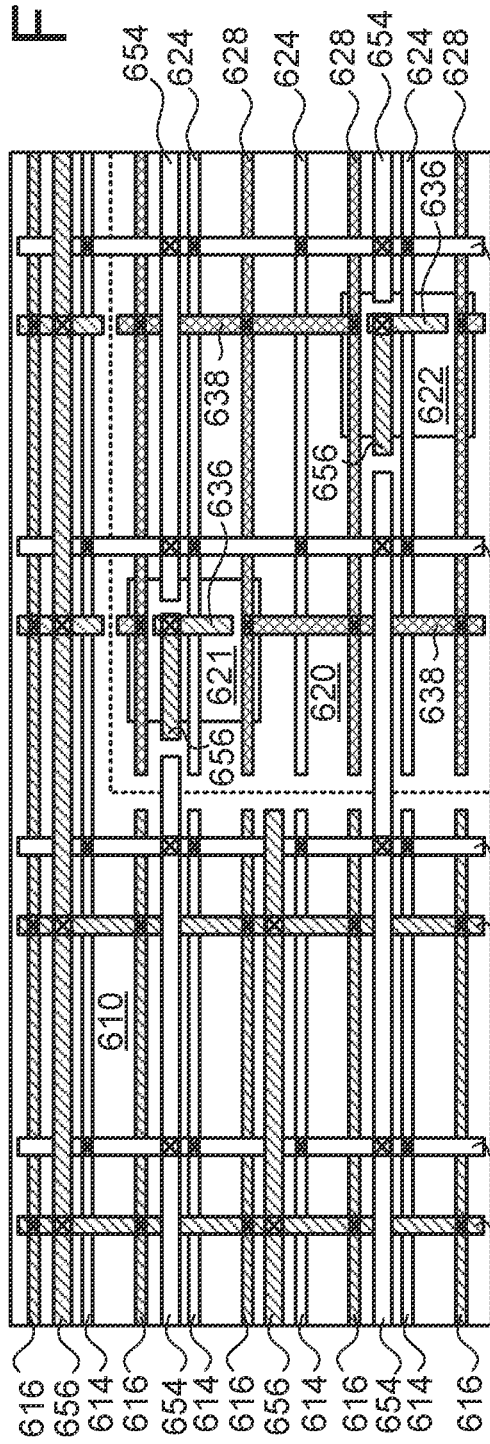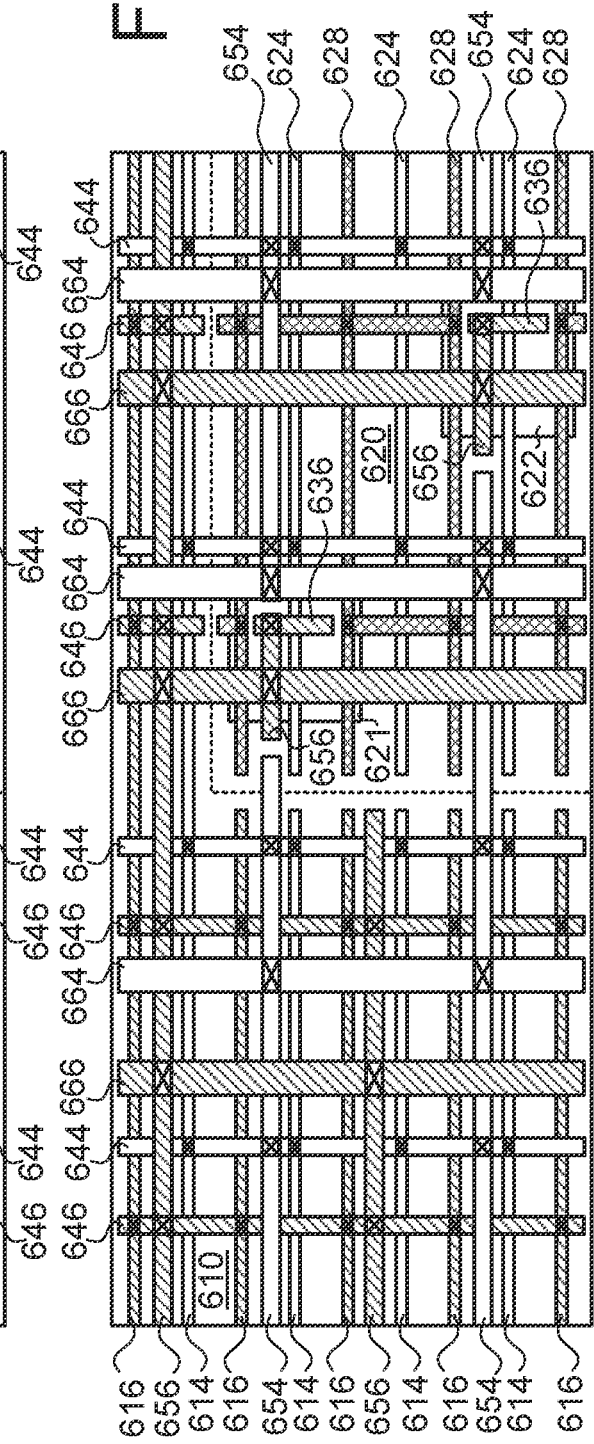

POWER MESH STRUCTURE FOR INTEGRATED CIRCUIT

This application claims the benefit of Taiwan Patent Application No. 110134814, filed Sep. 17, 2021, the subject matter of which is incorporated herein by reference.

FIELD OF THE INVENTION

The present invention relates to a power mesh structure for an integrated circuit, and more particularly to a power mesh structure using a power switch cell to control the switching operations of power domains.

BACKGROUND OF THE INVENTION

As the design of an integrated circuit (IC) is becoming more and more complicated, it is necessary to design the corresponding power meshes to provide working voltages to different power domains of the integrated circuit.

SUMMARY OF THE INVENTION

An embodiment of the present invention provides a power mesh structure for an integrated circuit. A chip of the integrated circuit has a power domain. A power switch cell is included in the power domain. The power mesh structure includes a first power mesh, a second power mesh, a third power mesh, a fourth power mesh and a fifth power mesh. The first power mesh located over the chip. The plural first power mesh includes plural power supply wires that are arranged in a first direction. The plural power supply wires of the first power mesh include plural local power wires and plural ground wires. The power switch cell is at least connected with one of the plural ground wires of the first power mesh. A voltage output terminal of the power switch cell is at least connected with one of the plural local power wires of the first power mesh. The second power mesh includes plural power supply wires that are arranged in a second direction. The plural power supply wires of the second power mesh include one global power wire and two local power wires. The global power wire and the two local power wires are arranged in a same column. The global power wire of the second power mesh is connected with a voltage input terminal of the power switch cell. The two local power wires of the second power mesh are connected with the plural local power wires of the first power mesh. The third power mesh includes a power supply wire that is arranged in the second direction. The power supply wire of the third power mesh includes one ground wire. The ground wire of the third power mesh is connected with the plural ground wires of the first power mesh. The fourth power mesh includes plural power supply wires that are arranged in the first direction. The plural power supply wires of the fourth power mesh include one global power wire and one ground wire. The global power wire and the ground wire are arranged in a same row. The global power wire of the fourth power wire is connected with the global power wire of the second power mesh. The ground wire of the fourth power mesh is connected with the ground wire of the third power mesh. The fifth power mesh includes plural power supply wires that are arranged in the second direction. The plural power supply wires of the fifth power mesh include one global power wire and one ground wire. The global power wire receives a working voltage. The ground wire receives a ground voltage. The global power wire of the fifth power mesh is connected with the global power wire of the fourth power mesh. The ground wire of the fifth power mesh is connected with the ground wire of the fourth power mesh.

Another embodiment of the present invention provides a power mesh structure for an integrated circuit. A chip of the integrated circuit has a first power domain and a second power domain. A power switch cell is included in the second power domain. The power mesh structure includes a first power mesh, a second power mesh, a third power mesh, a fourth power mesh and a fifth power mesh. The first power mesh is located over the chip. The plural first power mesh includes plural power supply wires that are arranged in a first direction. The plural power supply wires of the first power mesh include plural global power wires, plural local power wires and plural ground wires. The plural global power wires are located over the first power domain, and the plural local power wires are located over the second power domain. The power switch cell is at least connected with one of the plural ground wires of the first power mesh. A voltage output terminal of the power switch cell is at least connected with one of the plural local power wires of the first power mesh. The second power mesh includes plural power supply wires that are arranged in a second direction. The plural power supply wires of the second power mesh include one global power wire and two local power wires. The global power wire and the two local power wires are located over the second power domain and are arranged in a same column. The global power wire of the second power mesh is connected with a voltage input terminal of the power switch cell. The two local power wires of the second power mesh is connected with the plural local power wires of the first power mesh. The third power mesh includes plural power supply wires that are arranged in the second direction. The plural power supply wires of the third power mesh include plural global power wires and plural ground wire. The plural global power wires are located over the first power domain. The ground wires of the third power mesh are connected with the plural ground wires of the first power mesh. The plural global power wires of the third power mesh are connected with the plural global power wires of the first power mesh. The fourth power mesh includes plural power supply wires that are arranged in the first direction. The plural power supply wires of the fourth power mesh include plural global power wires and plural ground wires. The plural ground wires of the fourth power mesh are connected with the plural ground wires of the third power mesh. The global power wires of the fourth power mesh over the second power domain are connected with the global power wire of the second power mesh. The global power wires of the fourth power mesh over the first power domain are connected with the plural global power wires of the third power mesh. The fifth power mesh including plural power supply wires that are arranged in the second direction. The plural power supply wires of the fifth power mesh include one global power wire and one ground wire. The global power wire receives a working voltage. The ground wire receives a ground voltage. The global power wire of the fifth power mesh is connected with the plural global power wires of the fourth power mesh. The ground wire of the fifth power mesh is connected with the plural ground wires of the fourth power mesh.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A to 1E schematically illustrate a power mesh structure for an integrated circuit according to a first embodiment of the present invention;

FIGS. 2A to 2G schematically illustrate a power mesh structure for an integrated circuit according to a second embodiment of the present invention.

DETAILED DESCRIPTION OF PREFERRED EMBODIMENTS

FIGS. 1A to 1E schematically illustrate a power mesh structure for an integrated circuit according to a first embodiment of the present invention. In this embodiment, the power mesh structure comprises a first power mesh, a second power mesh and a third power mesh.

Figure 1A:
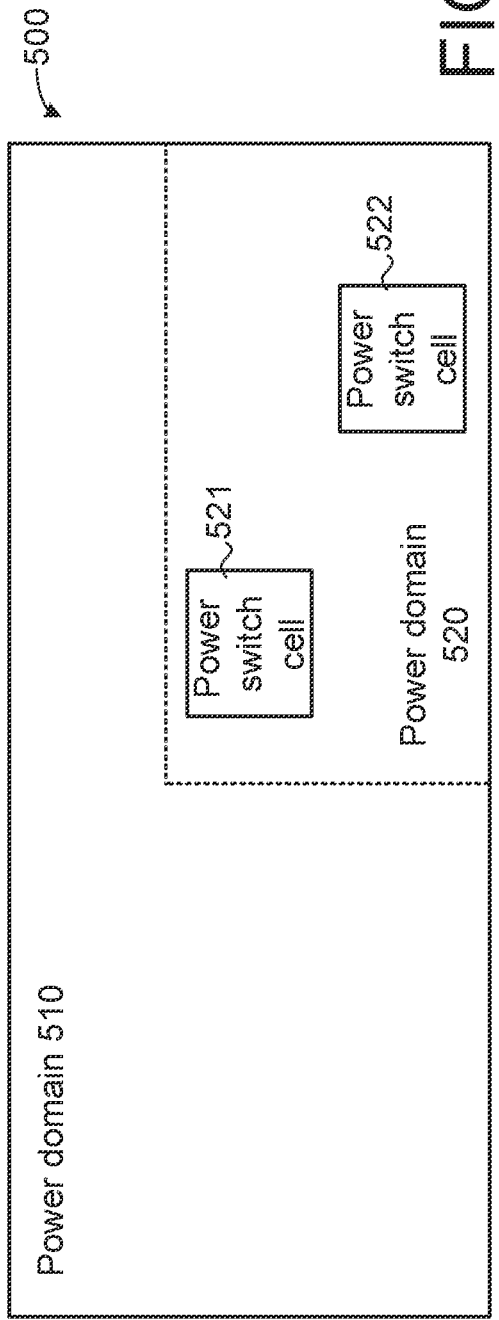

As shown in FIG. 1A, a chip 500 of the integrated circuit is partitioned into two power domains 510 and 520. Moreover, two power switch cells 521 and 522 are installed on the chip 500 to control the power switching operations of the power domain 520.

Figure 1B:
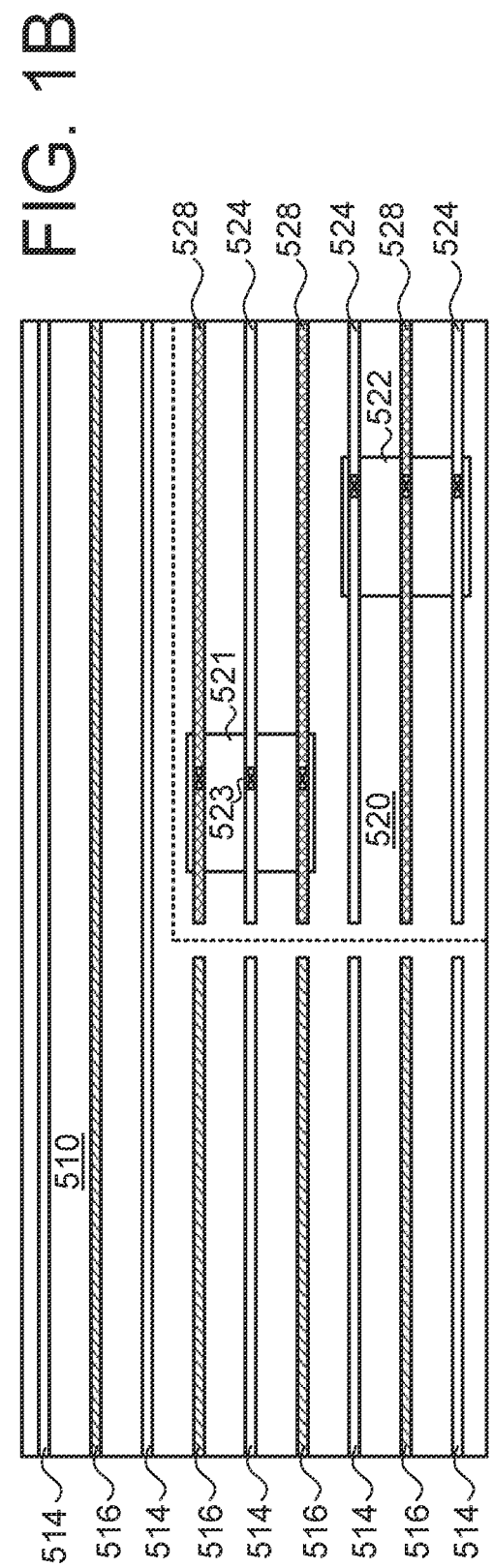

In FIG. 1B, the first power mesh is shown. The first power mesh is located over the chip 500. The first power mesh is partitioned into a first partial power mesh and a second partial power mesh. The first partial power mesh is located over the power domain 510, and the second partial power mesh is located over the power domain 520. Moreover, the first partial power mesh and the second partial power mesh can be coupled to the electronic components in the underlying power domains 510 and 520 through the corresponding via holes.

Please refer to FIG. 1B again. The first partial power mesh over the power domain 510 comprises plural horizontal power supply wires, including plural global power wires 516 and plural ground wires 514. The second partial power mesh over the power domain 520 comprises plural horizontal power supply wires, including plural local power wires 528 and plural ground wires 524. In the drawings, the global power wires 516 are indicated by oblique lines, the local power wires 528 are indicated by crossed lines, and the ground wires 514 and 524 are indicated by blank lines. In addition, the power switch cells 521 and 522 in the power domain 520 are connected with at least one local power wire 528 and at least one ground wire 524 through the corresponding via holes. For example, the power switch cell 521 is connected with the ground wire 524 through the via hole 523.

Please refer to FIG. 1B again. In the first power mesh, the first row, the second row and the third row are all located over the power domain 510. Consequently, each of the first row, the second row and the third row of the first power mesh is a complete horizontal power supply wire. Moreover, the fourth row, the fifth row, the sixth row, the seventh row, the eighth row and the ninth row of the first power mesh are located over both of the power domain 510 and the power domain 520. Consequently, each of the fourth row, the fifth row, the sixth row, the seventh row, the eighth row and the ninth row in the first power mesh comprises two separate horizontal power supply wires. For example, the fourth row of the first power mesh comprises two horizontal power supply wires, i.e., the global power wire 516 and the local power wire 528. Similarly, the fifth row of the first power mesh comprises two horizontal power supply wires, i.e., the ground wire 514 and the ground wire 524.

In FIG. 10, the second power mesh is shown. The second power mesh is located over the first power mesh. The second power mesh comprises plural vertical power supply wires, including plural global power wires 536, plural ground wires 534 and plural local power wire 538.

Please refer to FIG. 10 again. In the second power mesh, the vertical power supply wires over the power domain 510 comprises the global power wires 536 and the ground wires 534. In addition, the vertical power supply wires over the power domain 520 comprises the global power wires 536, the ground wires 534 and the local power wires 538. The ground wires 534 are connected with the ground wires 514 and 524 of the first power mesh through the corresponding via holes. In other words, the ground wires 514 and 524 of the first power mesh are electrically connected with each other through the ground wires 534 of the second power mesh. Moreover, the local power wire 538 is connected with the local power wire 528 of the first power mesh trough a via hole. The global power wires 536 are connected with the global power wires 516 of the first power mesh through the corresponding via holes. In addition, the global power wires 536 are connected with the power switch cells 521 and 522 through the corresponding via holes.

In FIG. 1D, the third power mesh is shown. The third power mesh is located over the third power mesh. The third power mesh comprises plural horizontal power supply wires, including plural global power wires 546 and plural ground wires 544. The ground wires 544 are connected with the ground wires 534 of the second power mesh through the corresponding via holes. The global power wires 546 are connected with the global power wire 536 of the second power mesh through the corresponding via holes.

As shown in FIG. 1E, the power mesh structure of the first embodiment is implemented with three metal layers M1, M5 and M6. The metal layer M1 is located at a level lower than the metal layer M5. The metal layer M5 is located at a level lower than the metal layer M6. The first power mesh is installed in the metal layer M1. The second power mesh is installed in the metal layer M5. The third power mesh is installed in the metal layer M6. It is noted that the three power meshes are not restricted to be installed in the three metal layers. As long as the first power mesh is located under the second power mesh and the second power mesh is located under the third power mesh, the power mesh structure is feasible.

In the power mesh structure of the first embodiment, the interconnect between the power wires with the same electrical property and the interconnect between the ground wires can be achieved through the corresponding via holes. Consequently, the ground wires 514, 524, 534 and 544 are electrically connected with each other, the global power wires 516, 536 and 546 are electrically connected with each other, and the local power wires 528 and 538 are electrically connected with each other. When the global power wires 546 and the ground wires 544 of the third power mesh receive a working voltage $V_{DD}$ and a ground voltage $V_{GND}$, respectively, the electronic components in the power domain 510 can be operated according to the working voltage $V_{DD}$ and the ground voltage $V_{GND}$.

In the first embodiment, the power switch cells 521 and 522 on the chip 500 are connected with the global power wires 536, the local power wires 528 and the ground wires

524. Moreover, each of the power switch cells 521 and 522 comprises a voltage input terminal and a voltage output terminal. The voltage input terminal is connected with the global power wires 536 of the second power mesh, and the voltage output terminal is connected with the local power wires 528 of the first power mesh. Consequently, when the power switch cells 521 and 522 are in a close state, the working voltage $V_{DD}$ on the global power wires 536 is transmitted to the local power wires 528 and 538. Under this circumstance, the electronic components in the power domain 520 are operated according to the working voltage $V_{DD}$ and the ground voltage $V_{GND}$. Whereas, when the power switch cells 521 and 522 are in an open state, the working voltage $V_{DD}$ on the global power wires 536 cannot be transmitted to the local power wires 528. Under this circumstance, the electronic components in the power domain 520 are disabled.

For example, when the integrated circuit is operated in a normal mode, the power switch cells 521 and 522 on the chip 500 are in the close state, and the electronic components in the power domains 510 and 520 are operated according to the working voltage $V_{DD}$ and the ground voltage $V_{GND}$. When the integrated circuit is operated in a sleep mode, the power switch cells 521 and 522 on the chip 500 are in the open state. Under this circumstance, only the electronic components in the power domain 510 are enabled, and the electronic components in the power domain 520 are disabled.

FIGS. 2A to 2G schematically illustrate a power mesh structure for an integrated circuit according to a second embodiment of the present invention. In this embodiment, the power mesh structure comprises a first power mesh, a second power mesh, a third power mesh, a fourth power mesh and a fifth power mesh.

Figure 2A:
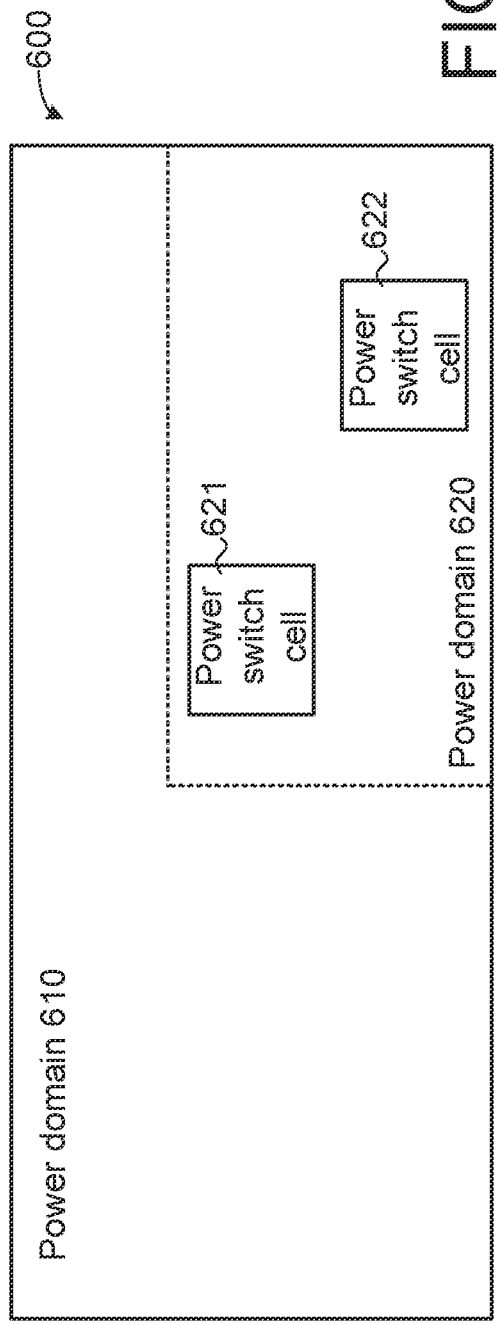

As shown in FIG. 2A, a chip 600 of the integrated circuit is partitioned into two power domains 610 and 620. Moreover, two power switch cells 621 and 622 are installed on the chip 600 to control the power switching operations of the power domain 620.

Figure 2B:
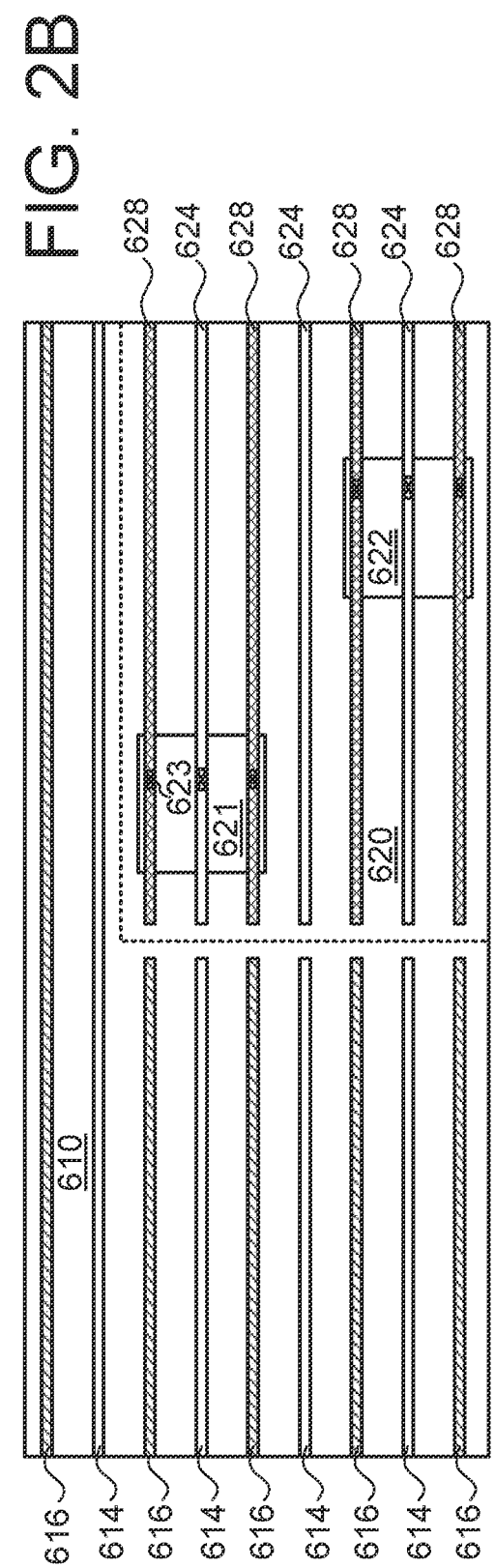

In FIG. 2B, the first power mesh is shown. The first power mesh is located over the chip 600. The first power mesh is partitioned into a first partial power mesh and a second partial power mesh. The first partial power mesh is located over the power domain 610, and the second partial power mesh is located over the power domain 620. Moreover, the first partial power mesh and the second partial power mesh can be coupled to the electronic components in the underlying power domains 610 and 620 through the corresponding via holes.

Please refer to FIG. 2B again. In the first power mesh, the first partial power mesh over the power domain 610 comprises plural horizontal power supply wires, including plural global power wires 616 and plural ground wires 614. The second partial power mesh over the power domain 620 comprises plural horizontal power supply wires, including plural local power wires 628 and plural ground wires 624. In the drawings, the global power wires 616 are indicated by oblique lines, the local power wires 628 are indicated by crossed lines, and the ground wires 614 and 624 are indicated by blank lines. In addition, the power switch cells 621 and 622 in the power domain 620 are connected with the local power wires 628 and the ground wires 624 through the corresponding via holes. For example, the power switch cell 621 is connected with the ground wire 624 through the via hole 623.

As shown in FIG. 2B, the first row and the second row of the first power mesh are both located over the power domain 610. Consequently, each of the first row and the second row of the first power mesh is a complete horizontal power supply wire. Moreover, the third row, the fourth row, the fifth row, the sixth row, the seventh row, the eighth row and the ninth row of the first power mesh are located over both of the power domain 610 and the power domain 620. Consequently, each of the third row, the fourth row, the fifth row, the sixth row, the seventh row, the eighth row and the ninth row in the first power mesh comprises two separate horizontal power supply wires. For example, the third row of the first power mesh comprises two horizontal power supply wires, i.e., the global power wire 616 and the local power wire 628. Similarly, the fourth row of the first power mesh comprises two horizontal power supply wires, i.e., the ground wire 614 and the ground wire 624.

In FIG. 2C, the second power mesh is shown. The second power mesh is located over the first power mesh and aligned with the power domain 620. The second power mesh comprises plural vertical power supply wires, including plural global power wires 636 and plural local power wires 638. The local power wires 638 of the second power mesh are connected with the local power wires 628 of the first power mesh trough the corresponding via holes. Moreover, the global power wires 636 of the second power mesh are connected with the power switch cells 621 and 622 through the corresponding via holes.

As shown in FIG. 2C, both of the first column and the second column in the second power mesh are located over the power domain 620. Each of the first column and the second column comprises plural separate vertical power supply wires. For example, the first column comprises three vertical power supply wires, including one global power wire 636 and two local power wires 638. In the first column, the global power wire 636 is located over the power switch cell 621, and the two ends of the global power wire 636 are located beside the two local power wires 638, respectively. Similarly, the second column comprises three vertical power supply wires, including one global power wire 636 and two local power wires 638. In the second column, the global power wire 636 is located over the power switch cell 622, and the two ends of the global power wire 636 are located beside the two local power wires 638, respectively.

In FIG. 2D, the third power mesh is shown. The third power mesh is located over the second power mesh. The third power mesh comprises plural vertical power supply wires, including plural global power wires 646 and plural ground wires 644.

Please refer to FIG. 2D again. In the third power mesh, the vertical power supply wires over the power domain 610 comprises plural global power wires 646 and plural ground wires 644, and the vertical power supply wires over the power domain 620 comprises the ground wires 644 only. In this embodiment, the ground wires 644 of the third power mesh are connected with the ground wires 614 and 624 of the first power mesh trough the corresponding via holes. In other words, the ground wires 614 and 624 of the first power mesh are electrically connected with the ground wires 644 of the third power mesh. Moreover, the global power wires 646 of the third power mesh are connected with the global power wires 616 of the first power mesh through the corresponding via holes.

In FIG. 2E, the fourth power mesh is shown. The third power mesh is located over the third power mesh. The third power mesh comprises plural horizontal power supply wires, including plural global power wires 656 and plural ground wires 654. The global power wires 654 of the fourth power mesh are connected with the ground wires 644 of the third power mesh through the corresponding via holes.

In the fourth power mesh, the horizontal power supply wires over the power domain 610 includes the global power wires 656 and the ground wires 654. The global power wires 656 of the fourth power mesh are connected with the global power wires 646 of the third power mesh through the corresponding via holes.

In this embodiment, each row of the fourth power mesh over the power domain 620 comprises separate horizontal power supply wires 656 and 654. In the first row, the global power wire 656 is located over the power switch cell 621, and the two ends of the global power wire 656 are located beside two ground wires 654, respectively. In the second row, the global power wire 656 is located over the power switch cell 622, and the two ends of the global power wire 656 are located beside the ground wires 654, respectively. In addition, the global power wires 656 are connected with the global power wires 636 of the second power mesh through the corresponding via holes.

In FIG. 2F, the fifth power mesh is shown. The fifth power mesh is located over the fourth power mesh. The fifth power mesh comprises plural vertical power supply wires, including plural global power wires 666 and plural ground wires 664. The ground wires 664 are connected with the ground wires 654 of the fourth power mesh through the corresponding via holes. The global power wires 666 of the fifth power mesh are connected with the global power wires 656 of the fourth power mesh through the corresponding via holes.

Figure 2G:
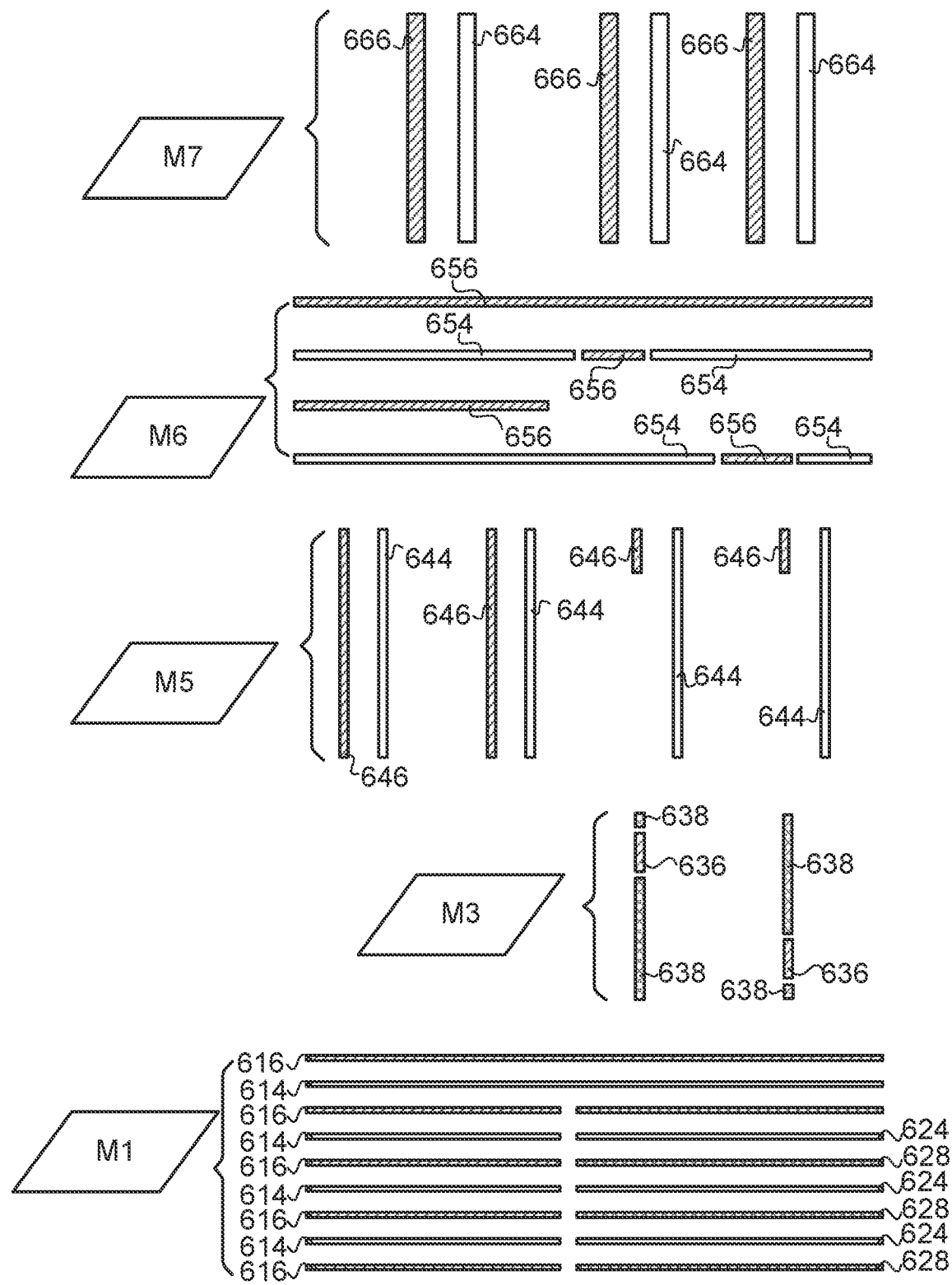

As shown in FIG. 2G, the power mesh structure of the second embodiment is implemented with five metal layers M1, M3, M5, M6 and M7. The metal layer M1 is located at a level lower than the metal layer M3. The metal layer M3 is located at a level lower than the metal layer M5. The metal layer M5 is located at a level lower than the metal layer M6. The metal layer M6 is located at a level lower than the metal layer M7. The first power mesh is installed in the metal layer M1. The second power mesh is installed in the metal layer M3. The third power mesh is installed in the metal layer M5. The fourth power mesh is installed in the metal layer M6. The fifth power mesh is installed in the metal layer M7. It is noted that the three power meshes are not restricted to be installed in the five metal layers. Any appropriate power mesh structure is feasible as long as the first power mesh is located under the second power mesh, the second power mesh is located under the third power mesh, the third power mesh is located under the fourth power mesh and the fourth power mesh is located under the fifth power mesh.

In the power mesh structure of the second embodiment, the interconnect between the power wires with the same electrical property and the interconnect between the ground wires can be achieved through the corresponding via holes. In other words, the ground wires 614, 624, 644, 654 and 664 are electrically connected with each other, the global power wires 616, 636, 646, 656 and 666 are electrically connected with each other, and the local power wires 628 and 638 are electrically connected with each other. Consequently, when the global power wires 666 and the ground wires 664 of the fifth power mesh receive a working voltage $V_{DD}$ and a ground voltage $V_{GND}$, respectively, the electronic components in the power domain 610 can be operated according to the working voltage $V_{DD}$ and the ground voltage $V_{GND}$.

In the second embodiment, the power switch cells 621 and 622 on the chip 600 are connected with the global power wires 636, the local power wires 628 and the ground wires 624. Moreover, each of the power switch cells 621 and 622 comprise a voltage input terminal and a voltage output terminal. The voltage input terminal is connected with the global power wires 636 of the second power mesh, and the voltage output terminal is connected with the local power wires 628 of the first power mesh. When the power switch cells 621 and 622 are in an open state, the working voltage $V_{DD}$ on the global power wires 636 cannot be transmitted to the local power wires 628. Under this circumstance, the electronic components in the power domain 620 are disabled. Whereas, when the power switch cells 621 and 622 are in a close state, the working voltage $V_{DD}$ on the global power wire 636 is transmitted to the local power wires 628 and 638. Under this circumstance, the electronic components in the power domain 620 are operated according to the working voltage $V_{DD}$ and the ground voltage $V_{GND}$.

For example, when the integrated circuit is operated in a normal mode, the power switch cells 621 and 622 on the chip 600 are in the close state, and the electronic components in the power domains 610 and 620 are operated according to the working voltage $V_{DD}$ and the ground voltage $V_{GND}$. When the integrated circuit is operated in a sleep mode, the power switch cells 621 and 622 on the chip 600 are in the open state. Under this circumstance, only the electronic components in the power domain 610 are enabled, and the electronic components in the power domain 620 are disabled.

In the power mesh structure of the second embodiment, the power meshes over the power domain 620 can be specially designed. For example, the power wires with different electrical properties are arranged in the same column or the same row to reduce the layout area of the power mesh on the material layer. Moreover, the remaining metal layer region can be used for the layout design of the signal wires.

In the second embodiment, the two power switch cells 621 and 622 are aligned with the power domain 620 of the chip 600. It is noted that the number of the power switch cells in the power domain 620 may be varied according to the practical requirement. For example, the arrangement of a single power switch cell can also achieve the purpose of the present invention. The associated concepts will be described as follows.

Figure 3:
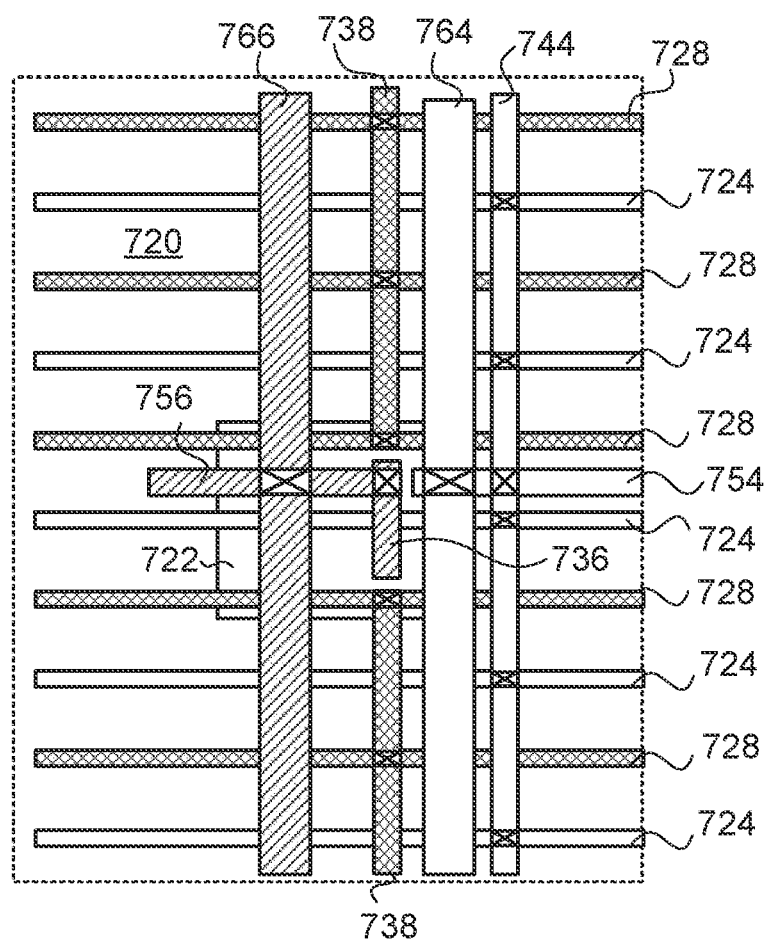
FIG. 3 schematically illustrates a power mesh structure for an integrated circuit according to a third embodiment of the present invention.

FIG. 3 schematically illustrates a power mesh structure for an integrated circuit according to a third embodiment of the present invention. In this embodiment, the power mesh structure comprises a first power mesh, a second power mesh, a third power mesh, a fourth power mesh and a fifth power mesh. In FIG. 3, the local power wires 728 and 738 are indicated by crossed lines, the ground wires 724, 744, 754 and 764 are indicated by blank lines, and the global power wires 736, 756 and 766 are indicated by oblique lines.

As shown in FIG. 3, a power switch cell 722 is designed in the power domain 720 of the chip to control the power switching operations of the power domain 720.

The first power mesh is located over the chip. The first power mesh over the power domain 720 comprises plural horizontal power supply wires, including plural local power wires 728 and plural ground wires 724. In addition, the power switch cell 722 in the power domain 720 is connected with the local power wire 728 and the ground wire 724 through the corresponding via holes. The local power wire 728 and the ground wire 724 are coupled to the electronic components in the underlying power domain 720 through the corresponding via holes.

The second power mesh is located over the first power mesh. The second power mesh comprises plural vertical power supply wires, including one global power wire 736 and two local power wires 738. The global power wire 736 and the two local power wires 738 are arranged in the same column. That is, each column comprises three separate vertical power supply wires, i.e., the global power wire 736 and the two local power wires 738. The global power wire 736 is located over the power switch cell 722. The two ends of the global power wire 736 are located beside the two local power wires 738, respectively. Under this circumstance, the local power wires 738 are connected with the local power wire 728 of the first power mesh trough the corresponding via holes. The global power wire 736 is connected with the power switch cell 722 through the corresponding via hole.

The third power mesh is located over the second power mesh. The third power mesh comprises a vertical power supply wire, i.e., a ground wire 744. The ground wire 744 of the third power mesh is connected with the ground wires 724 of the first power mesh through the corresponding via holes. In other words, the ground wires 724 of the first power mesh are electrically connected with each other through the ground wire 744 of the third power mesh.

The fourth power mesh is located over the third power mesh. The fourth power mesh comprises plural horizontal power supply wires, including a local power wire 756 and a ground wire 754. The global power wire 756 and ground wire 754 are arranged in the same row. That is, each row comprises two separate horizontal power supply wires, i.e., the global power wire 756 and the ground wire 754. The global power wire 756 is located over the power switch cell 722. The global power wire 756 is connected with the global power wire 736 of the second power mesh trough the corresponding via hole. The ground wire 754 is connected with the ground wire 744 of the third power mesh through the corresponding via hole.

The fifth power mesh is located over the fourth power mesh. The fifth power mesh comprises plural vertical power supply wires, including a global power wire 766 and a ground wire 764. The ground wire 764 of the third power mesh is connected with the ground wire 754 of the fourth power mesh through the corresponding via hole. The global power wire 766 of the fifth power mesh is connected with the global power wire 756 of the fourth power mesh through the corresponding via hole.

In the power mesh structure of the third embodiment, the interconnect between the power wires with the same electrical property and the interconnect between the ground wires can be achieved through corresponding via holes. In other words, the ground wires 724, 744, 754 and 764 are electrically connected with each other, the global power wires 736, 756 and 766 are electrically connected with each other, and the local power wires 728 and 738 are electrically connected with each other. Consequently, the global power wire 766 and the ground wire 764 of the fifth power mesh receive a working voltage $V_{DD}$ and a ground voltage $V_{GND}$, respectively.

In the third embodiment, the power switch cell 722 of the chip is connected with the global power wire 736, the local power wire 728 and the ground wire 724. Moreover, the power switch cell 722 comprises a voltage input terminal and a voltage output terminal. The voltage input terminal is connected with the global power wire 736 of the second power mesh. The voltage output terminal is connected with the local power wire 728 of the first power mesh.

When the power switch cell 722 is in an open state, the working voltage $V_{DD}$ on the global power wire 736 cannot be transmitted to the local power wires 728. Under this circumstance, the electronic components in the power domain 720 are disabled. Whereas, when the power switch cell 722 is in a close state, the working voltage $V_{DD}$ on the global power wire 736 is transmitted to the local power wires 728 and 738. Under this circumstance, the electronic components in the power domain 720 are operated according to the working voltage $V_{DD}$ and the ground voltage $V_{GND}$.

From the above descriptions, the present invention provides a power mesh structure for an integrated circuit. At least one power switch cell is installed on the chip of the integrated circuit to control the switching operations of the power domains. Moreover, the power meshes of the power mesh structure can be specially designed. For example, the power wires with different electrical properties are arranged in the same column or the same row to reduce the layout area of the power mesh on the material layer.

In the above embodiments, the power mesh is constructed by using plural horizontal power supply wires and plural vertical power supply wires. Alternatively, the power mesh may be constructed by using horizontal power supply wires that are arranged in two different directions. For example, in the power mesh structure of the second embodiment, the first power mesh comprises plural power supply wires in the first direction, the second power mesh comprises plural power supply wires in the second direction, the third power mesh comprises plural power supply wires in the second direction, the fourth power mesh comprises plural power supply wires in the first direction, and the fifth power mesh comprises plural power supply wires in the second direction.

In some other embodiments, the installation positions of the plural power meshes in the power mesh structure are not restricted. For example, in the embodiment of FIG. 2G, the position of the second power mesh in the metal layer M3 and the position of third power mesh in the metal layer M5 may be exchanged. That is, the second power mesh is installed in the metal layer M5, and the third power mesh is installed in the metal layer M3. Moreover, the position of the third power mesh in the metal layer M5 and the position of the fourth power mesh in the metal layer M6 may be exchanged. That is, the third power mesh is installed in the metal layer M6, and the fourth power mesh is installed in the metal layer M5.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power mesh structure for an integrated circuit, a chip of the integrated circuit having a power domain, a power switch cell being included in the power domain, the power mesh structure comprising:

a first power mesh located over the chip, wherein the first power mesh comprises plural power supply wires that are arranged in a first direction, and the plural power supply wires of the first power mesh comprise plural local power wires and plural ground wires, wherein the power switch cell is at least connected with one of the plural ground wires of the first power mesh, and a voltage output terminal of the power switch cell is at least connected with one of the plural local power wires of the first power mesh;

a second power mesh comprising plural power supply wires that are arranged in a second direction, wherein the plural power supply wires of the second power mesh comprise one global power wire and two local power wires, and the global power wire and the two local power wires are arranged in a same column, wherein the global power wire of the second power mesh is connected with a voltage input terminal of the power switch cell, and the two local power wires of the second power mesh are connected with the plural local power wires of the first power mesh;

a third power mesh comprising a power supply wire that is arranged in the second direction, wherein the power supply wire of the third power mesh comprises one ground wire, and the ground wire of the third power mesh is connected with the plural ground wires of the first power mesh;

a fourth power mesh comprising plural power supply wires that are arranged in the first direction, wherein the plural power supply wires of the fourth power mesh comprise one global power wire and one ground wire, and the global power wire and the ground wire are arranged in a same row, wherein the global power wire of the fourth power wire is connected with the global power wire of the second power mesh, and the ground wire of the fourth power mesh is connected with the ground wire of the third power mesh; and a fifth power mesh comprising plural power supply wires that are arranged in the second direction, wherein the plural power supply wires of the fifth power mesh comprise one global power wire and one ground wire, wherein the global power wire receives a working voltage, and the ground wire receives a ground voltage, wherein the global power wire of the fifth power mesh is connected with the global power wire of the fourth power mesh, and the ground wire of the fifth power mesh is connected with the ground wire of the fourth power mesh.

2. The power mesh structure as claimed in claim 1, wherein the plural local power wires and the plural ground wires of the first power mesh are coupled to plural electronic components in the power domain.

3. The power mesh structure as claimed in claim 2, wherein when the power switch cell is in a close state, the electronic components in the power domain are operated according to the working voltage and the ground voltage, wherein when the power switch cell is in an open state, the electronic components in the power domain are disabled.

4. The power mesh structure as claimed in claim 1, wherein the fifth power mesh is located over the fourth power mesh, the fourth power mesh is located over the third power mesh, the third power mesh is located over the second power mesh, and the second power mesh is located over the first power mesh.

5. The power mesh structure as claimed in claim 1, wherein the first direction is a horizontal direction, and the second direction is a vertical direction.

6. A power mesh structure for an integrated circuit, a chip of the integrated circuit having a first power domain and a second power domain, a power switch cell being included in the second power domain, the power mesh structure comprising:

a first power mesh located over the chip, wherein the first power mesh comprises plural power supply wires that are arranged in a first direction, and the plural power supply wires of the first power mesh comprise plural global power wires, plural local power wires and plural ground wires, wherein the plural global power wires are located over the first power domain, the plural local power wires are located over the second power domain, the power switch cell is at least connected with one of the plural ground wires of the first power mesh, and a voltage output terminal of the power switch cell is at least connected with one of the plural local power wires of the first power mesh;

a second power mesh comprising plural power supply wires that are arranged in a second direction, wherein the plural power supply wires of the second power mesh comprise one global power wire and two local power wires, and the global power wire and the two local power wires are located over the second power domain and are arranged in a same column, wherein the global power wire of the second power mesh is connected with a voltage input terminal of the power switch cell, and the two local power wires of the second power mesh is connected with the plural local power wires of the first power mesh;

a third power mesh comprising plural power supply wires that are arranged in the second direction, wherein the plural power supply wires of the third power mesh comprise plural global power wires and plural ground wires, wherein the plural global power wires are located over the first power domain, the ground wires of the third power mesh are connected with the plural ground wires of the first power mesh, and the plural global power wires of the third power mesh are connected with the plural global power wires of the first power mesh;

a fourth power mesh comprising plural power supply wires that are arranged in the first direction, wherein the plural power supply wires of the fourth power mesh comprise plural global power wires and plural ground wires, wherein the plural ground wires of the fourth power mesh are connected with the plural ground wires of the third power mesh, the global power wires of the fourth power mesh over the second power domain are connected with the global power wire of the second power mesh, and the global power wires of the fourth power mesh over the first power domain are connected with the plural global power wires of the third power mesh; and a fifth power mesh comprising plural power supply wires that are arranged in the second direction, wherein the plural power supply wires of the fifth power mesh comprise one global power wire and one ground wire, wherein the global power wire receives a working voltage, and the ground wire receives a ground voltage, wherein the global power wire of the fifth power mesh is connected with the plural global power wires of the fourth power mesh, and the ground wire of the fifth power mesh is connected with the plural ground wires of the fourth power mesh.

7. The power mesh structure as claimed in claim 6, wherein the plural local power wires and the plural ground wires of the first power mesh are coupled to plural electronic components in the second power domain, and the plural global power wires and the plural ground wires of the first power mesh are coupled to plural electronic components in the first power domain.

8. The power mesh structure as claimed in claim 7, wherein the plural electronic components in the first power domain are operated according to the working voltage and the ground voltage.

9. The power mesh structure as claimed in claim 7, wherein when the power switch cell is in a close state, the electronic components in the second power domain are operated according to the working voltage and the ground voltage, wherein when the power switch cell is in an open state, the electronic components in the second power domain are disabled.

10. The power mesh structure as claimed in claim 6, wherein the fifth power mesh is located over the fourth power mesh, the fourth power mesh is located over the third power mesh, the third power mesh is located over the second power mesh, and the second power mesh is located over the first power mesh.

11. The power mesh structure as claimed in claim 6, wherein the first direction is a horizontal direction, and the second direction is a vertical direction.

* * * * *